United States Patent [19]

Aronowitz et al.

[11] Patent Number: 5,372,952
[45] Date of Patent: Dec. 13, 1994

[54] METHOD FOR FORMING ISOLATED SEMICONDUCTOR STRUCTURES

[75] Inventors: Sheldon Aronowitz, San Jose; Courtney L. Hart, Los Gatos, both of Calif.

[73] Assignee: National Semiconductor Corporation, Santa Clara, Calif.

[21] Appl. No.: 863,651

[22] Filed: Apr. 3, 1992

[51] Int. Cl.$^5$ ............................................. H01L 21/76
[52] U.S. Cl. ........................................ 437/24; 437/26; 437/62
[58] Field of Search ................. 437/24, 26, 62, 69, 437/71, 72

[56] References Cited

U.S. PATENT DOCUMENTS

| | | | |
|---|---|---|---|
| 3,663,308 | 5/1972 | Davey | 437/24 |
| 4,810,667 | 3/1989 | Zorinsky et al. | 437/62 |
| 5,043,292 | 8/1991 | Aronowitz et al. | 437/26 |

FOREIGN PATENT DOCUMENTS

| | | | |
|---|---|---|---|
| 55-68651 | 5/1980 | Japan | 437/24 |
| 55-75238 | 6/1980 | Japan | 437/24 |
| 56-110247 | 9/1981 | Japan | 437/24 |
| 57-63841 | 4/1982 | Japan | 437/24 |
| 64-744 | 1/1989 | Japan | 437/24 |

OTHER PUBLICATIONS

Cullis et al., "Comparative Study of Annealed Neon-, Argon-, and Krypton-Ion Implantation Damage in Silicon," J. Appl. Phys. 49(10), Oct. 1978, pp. 5188–5198.

Sakura et al., "A Dielectrically Isolated Complementary Bipolar Technique for Analog/Digital Compatible LSI's," IEEE Transactions on Electron Devices, vol. ED-30, No. 10, Oct. 1983, pp. 1278–1283.

Sugawara et al., "350V Analog-Digital Compatible Power IC Technologies," IEDM 1985, pp. 728–731.

Suzuki et al., "Deformation in Dielectric-Isolated Substrates and Its Control by a Multilayer Polysilicon Support Structure," Solid-State Science and Technology, vol. 127, No. 7, Jul. 1980, pp. 1537–1542.

Wildi et al., "New High Voltage IC Technology," 1984 IEDM, pp. 262–265.

Wong et al., "Gettering of Gold and Copper with Implanted Carbon in Silicon," 1988, American Institute of Physics, pp. 889–891.

Zorinsky et al., "The 'Islands' Method–A Manufacturable Porous Silicon SOI Technology," IEDM 1986, pp. 431–434.

*Primary Examiner*—Olik Chaudhuri
*Assistant Examiner*—Ourmazd S. Ojan
*Attorney, Agent, or Firm*—Skjerven, Morrill, MacPherson, Franklin & Friel

[57] ABSTRACT

A number of dielectrically isolated single crystal islands are formed by implanting neon or other group Zero ions into a semiconductor substrate, preferably silicon, at a sufficiently high energy to created an amorphized region in the interior of the substrate, without excessively damaging the substrate surface through which the ions pass. The amorphized regions are highly resistive, and are suitable for isolation in some applications. Where better isolation is desired, a dielectric isolation structure is formed as follows. Trenches are formed down into the amorphized regions, and the substrate is heavily oxidized to convert the amorphized regions into buried oxide regions and the island sidewalls into oxide. The islands are made thicker by removing the oxide from the islands' top surfaces and sidewalls, and growing epitaxial silicon over the substrate. Second trenches are formed down to the buried oxide regions, and the substrate is again oxidized to convert the islands' sidewalls to oxide. The remaining open space of the second trenches is filled, and devices of any desired type are formed in the single crystal islands.

23 Claims, 7 Drawing Sheets

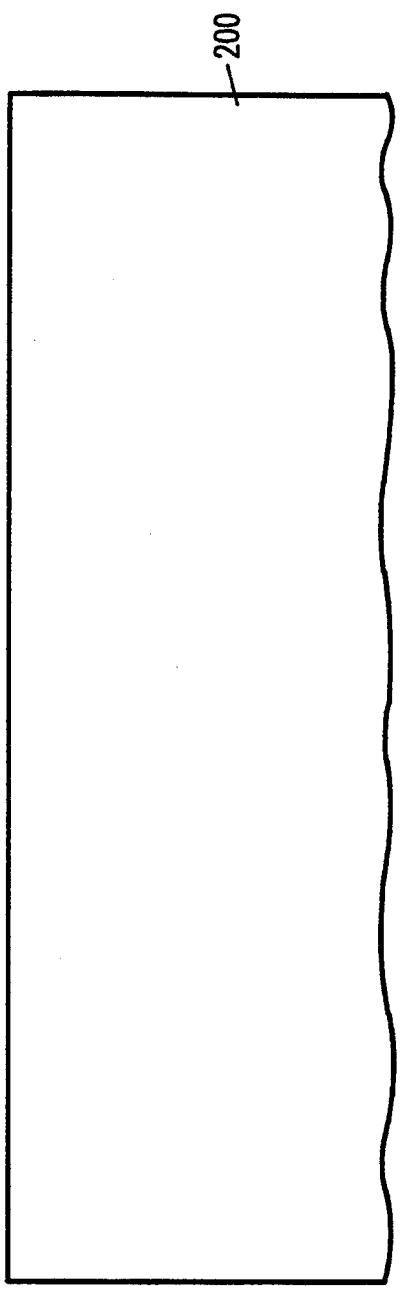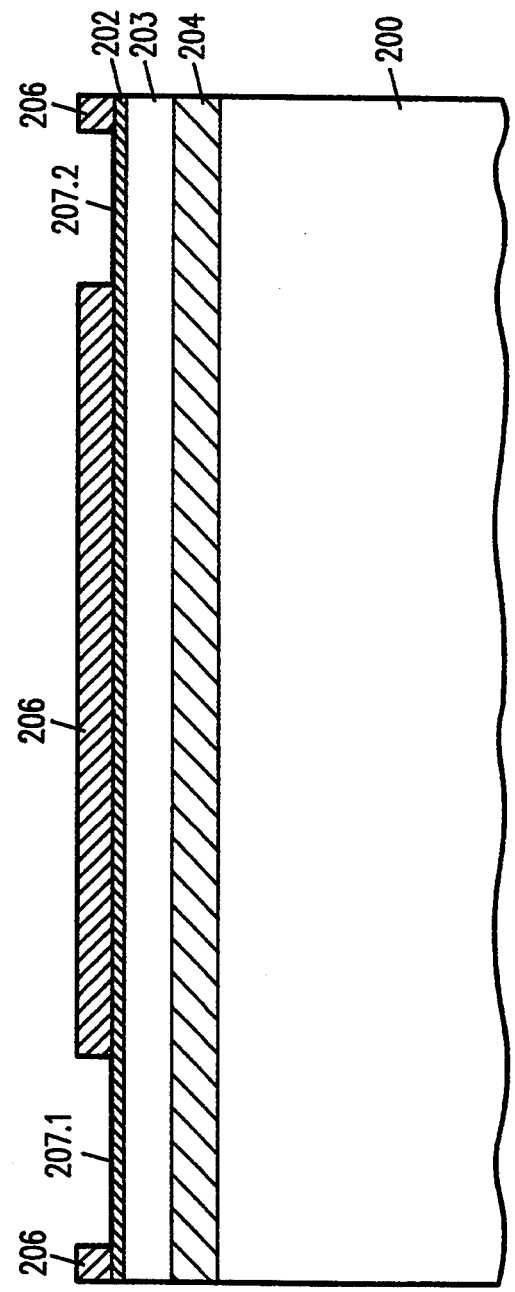

METHOD FOR FORMING ISOLATED SEMICONDUCTOR STRUCTURES

BACKGROUND OF THE INVENTION

1. Field of the Invention

The present invention relates to dielectric isolation structures for semiconductor devices, and more particularly to dielectric isolation structures fabricated using ultra high energy buried implants.

2. Description of Related Art

Dielectric substrate isolation is particularly useful in high voltage power integrated circuits and radiation hardened devices. Devices fabricated with the alternative junction isolation technology suffer poor breakdown performance by comparison.

One class of dielectric isolated substrate techniques generally involves the formation of v-shaped isolation moats in one surface of a single crystal silicon wafer and the subsequent deposition thereon of a relatively thick layer or layers of polysilicon. The single crystal is then precision lapped and polished from the other surface, until dielectric isolated islands of single crystal material emerge. An early version of this technique is described in an article by Suzuki et al., "Deformation in Dielectric-Isolated Substrates and Its Control by a Multilayer Polysilicon Support Structure," J. Electrochem. Soc.: Solid-State Science and Technology, Vol. 127, No. 7, July 1980, pp. 1537–1542. Note that this technique requires precision lapping and polishing, and the deposition of relatively thick polysilicon layers.

A technique that avoids the heed for precision lapping and polishing is disclosed in U.S. Pat. No. 4,810,667, issued Mar. 7, 1989 to Zorinsky et al. The structure involves the deposition of multiple polysilicon layers, the first being a very heavily doped and porous N+ layer followed by other less heavily doped layers. Trenches are formed down to the N+layer, and the N+ layer then is oxidized. Together, the oxide filled trenches and the oxidized N+ layer isolate the less heavily doped polysilicon layers, which form elements of subsequently fabricated devices. Unfortunately, this technique requires multiple depositions of doped polysilicon.

SUMMARY OF THE INVENTION

The present invention avoids the need for precision lapping and polishing in the formation of the isolation structures, as well as avoidance of deposition of a thick polysilicon layer.

The present invention further avoids the need for epitaxially growing a very highly doped polysilicon layer in the formation of isolation structures.

The present invention further provides good gettering action.

These and other advantages are realized in the present invention, which in one embodiment comprises the formation of a dielectrically isolated single crystal semiconductor island in a single crystal semiconductor body. Ions of a group Zero element are implanted into the body through a surface of the body. The energy and dose of the ions is selected to cause substantial damage to a region inside the body, but to avoid causing substantial damage to the region of the body between the surface and the damaged, or amorphized, interior region. Then, a trench is formed from the surface to intersect with the amorphized region. The damaged region is of high resistance, which is suitable for isolation purposes in some applications.

In a further embodiment, the entire body is subjected to an oxidizing environment after trench formation to convert the amorphized region under the island and the island sidewall to oxide.

In a further embodiment, the thickness of the island is increased by removing oxide from the island surface, and depositing epitaxial silicon to the desired thickness. The epitaxial layer thereby formed is also single crystal. A second trench is formed in the epitaxial layer, from the surface thereof to intersect with the now oxidized, previously amorphized layer. A dielectric layer then is formed on the sidewalls of the island of increased thickness.

In a further embodiment wherein the semiconductor body is silicon, a particularly advantageous implant material is neon.

BRIEF DESCRIPTION OF THE DRAWINGS

FIGS. 2–7 are cross-section views of a dielectric isolation structure in successive stages of fabrication in accordance with a unit dielectric insulation process.

DESCRIPTION OF THE PREFERRED AND OTHER EMBODIMENTS

Figure 1:
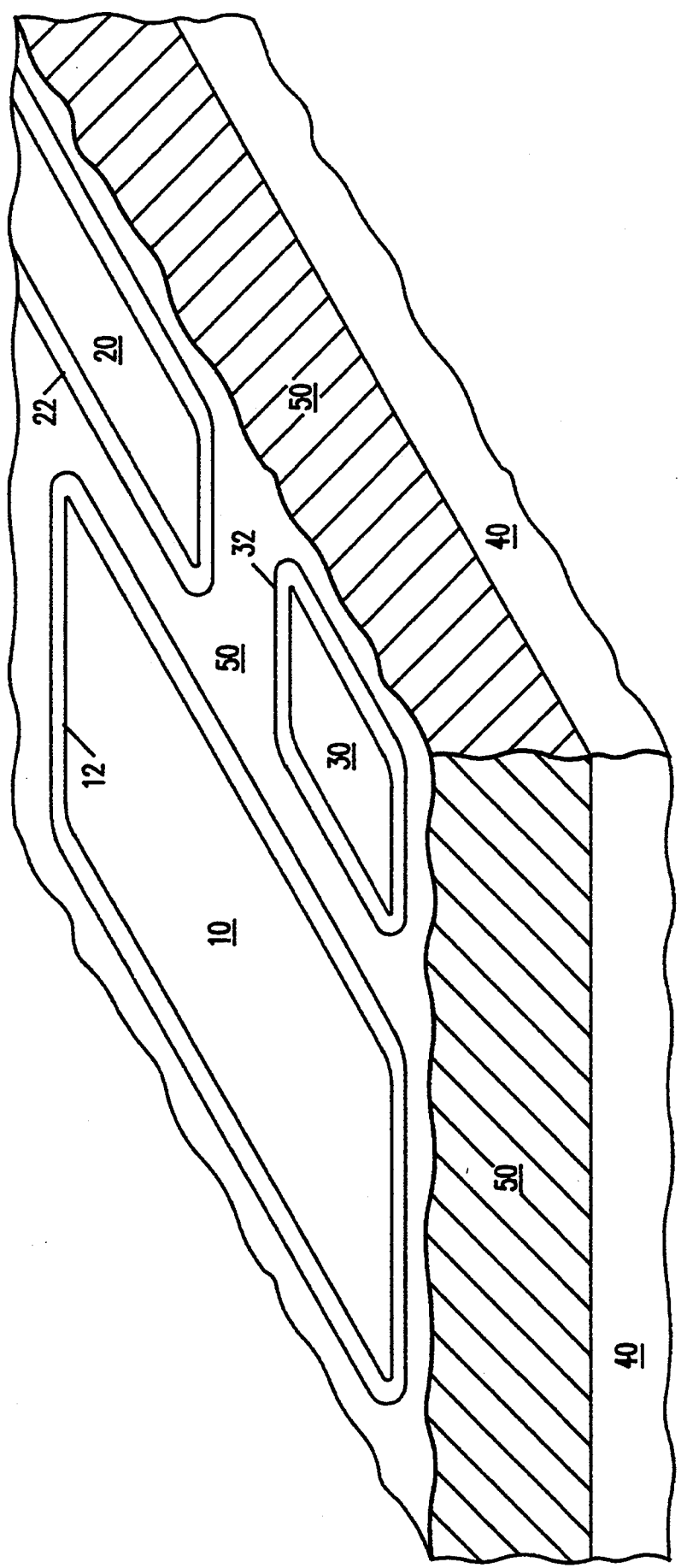
FIG. 1 is a cross-sectional three dimensional view of bidirectionally isolated single crystal islands.

In the following discussion of a unit process for forming dielectric isolation structures, single crystal islands of any convenient shape are formed in a semiconductor body of such material as silicon or germanium. However, due to the programmed behavior of most contemporary layout systems, the islands typically are rectangular as shown by islands 10, 20 and 30 in FIG. 1. The islands 10, 20 and 30 in the single crystal body 40 are surrounded by oxide film 12, 22 and 32 respectively, and also by a fill material 50, which may be conductive, semiconductive, or insulative, but which preferably has a similar coefficient of expansion as the islands 10, 20, and 30 and body 40. For example, polysilicon or silicon dioxide may be used with a silicon substrate. Note that once the single crystal islands are created, any desired integrated circuit component may be fabricated within the islands using any suitable semiconductor fabrication process.

The unit process includes the use of an ultra-high energy ion implant into single crystal silicon. The depth to which an ion becomes implanted is proportional to its kinetic energy. The implanted distribution in an amorphous target is roughly a Gaussian distribution characterized by a mean, known as the projected range, and a standard deviation, known as the projected straggle. In a single crystal target, however, the projected range and projected straggle for a given implant may be different than that in amorphous material, due to a phenomena known as channeling. Higher ion energy tends to dechannel implants. In any event, projected range and projected straggle data for various materials including silicon, silicon dioxide, and photoresist have been determined and reported in various commonly consulted reference works.

The dielectric isolation structure 200 shown in various stages of fabrication in FIGS. 2–7 is formed on the principle, which has been shown experimentally, that extensive damage or complete amorphization takes place in a silicon lattice region where an ion implant peaks, and that lattice damage is not distributed throughout the pathway of the energetic dopant. For example, an ultra-high energy implant of silicon or phosphorous can be used to amorphize buried regions in silicon, as described in U.S. Pat. No. 5,043,292, issued Aug. 27, 1991 to Aronowitz et al. If silicon is used as the amorphizing agent for a silicon substrate, the substrate will not ultimately be electrically altered. However, when silicon is used as the amorphizing agent, oxidation in the damaged layer is enhanced only by a factor of approximately two, with respect to crystalline silicon. If an n-type dopant species such as phosphorous is used as the amorphizing agent, the relative oxidation rate of the damaged silicon layer in the substrate is enhanced considerably, but the intrinsic electrical characteristics of the substrate is altered in neighboring regions.

We have found that an ultra-high energy implant of materials such as neon is an advantageous technique for forming isolation structures in a variety of semiconductor materials. The ultra-high energy neon implant suppresses complete recrystallization, thereby creating high resistivity zones which are sufficient for isolation in some applications.

Figure 7:
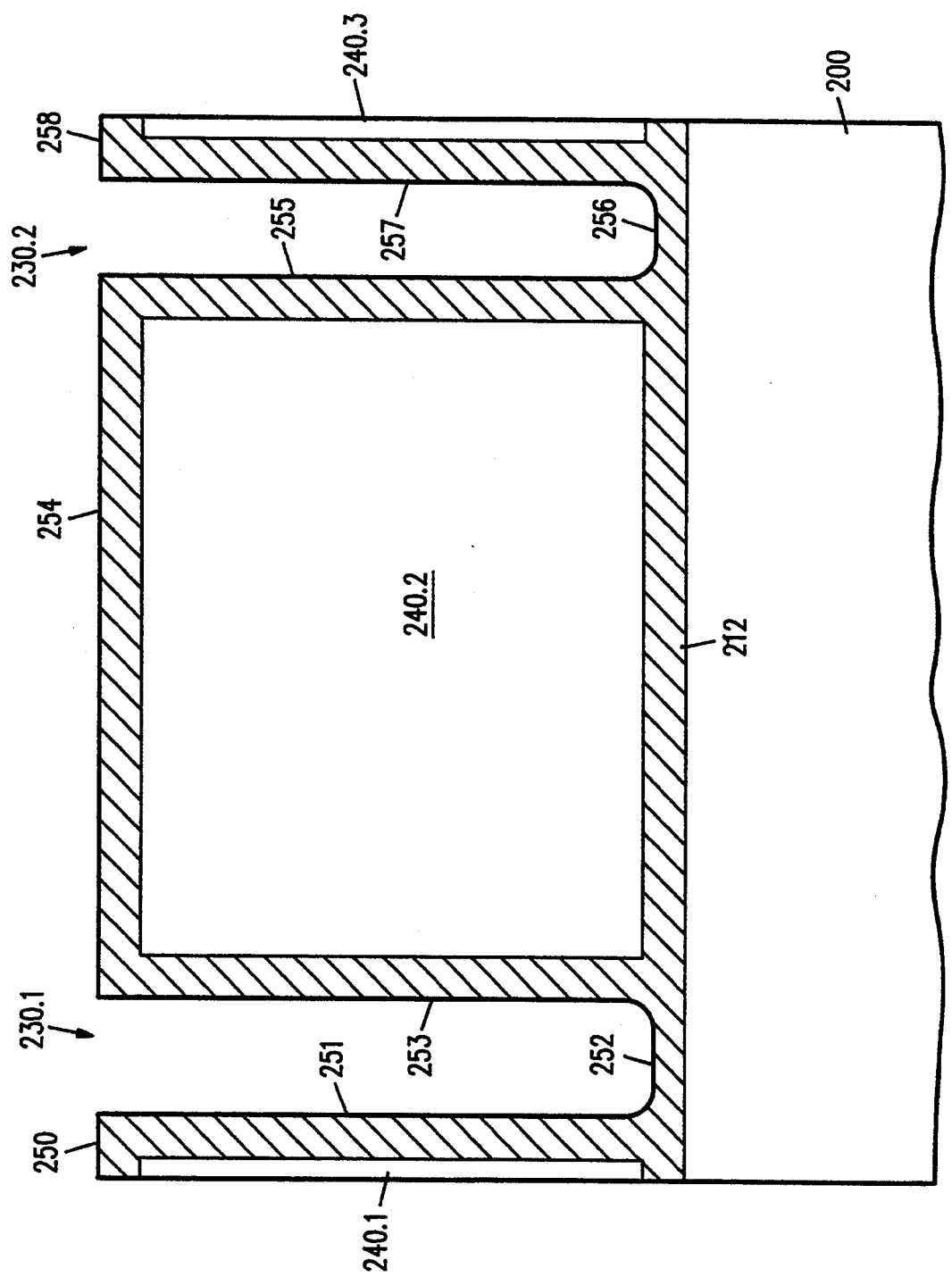

We have found further that the ultra-high energy implant of materials such as neon is a particularly advantageous technique for forming in silicon excellent dielectric isolation structures such as that of FIG. 7 for three reasons. First, neon implanted into a silicon substrate at, for example, 2 MeV has a projected range of about eight microns. A region of the silicon substrate about the projected range is amorphized without an alteration of the intrinsic electrical characteristics of the silicon substrate in other regions. Naturally, the projected range of the implant, hence the depth of the amorphized region, may be varied by varying the implant energy.

Second, the use of neon in forming the amorphized region suppresses full epitaxial regrowth. The suppression of complete recrystallization maintains channels for oxygen diffusion and enhances the reaction of silicon with oxygen. The enhancement is a result of "dangling" silicon bonds formed by the implantation. The amount of initial lattice damage from the implant is strongly dependent on the dose and rate, which along with crystal orientation directly affect the final lattice disorder after annealing. Generally, about one mole percent of neon is sufficient to prevent epitaxial regrowth.

Moreover, neon in the amorphized region provides enhanced gettering action. Gettering means the removal of metallic impurities from the active device areas of integrated circuits. Extend defects in areas of the silicon into which neon is implanted act as gettering sites. The strong gettering effect of neon is comparable to that of Argon and Carbon.

Other group Zero elements may be used if desired. Helium is very light, and the dose level should be quite high to amorphize silicon. Argon requires greater energy to achieve the same projected range as neon, although a lower dose would be required to achieve the desired degree of amorphization. Krypton is even heavier, and requires even greater energy than argon to achieve the same projected range.

The effectiveness of neon in silicon is due to the nature of the silicon displacements caused by neon. Silicon displacement, or damage, occurs primarily by electronic interaction. When most of the kinetic energy of the implanted ion has been dissipated through electronic interaction, collisions and, concomitantly, amorphization occur. Collisions generally occur when the kinetic energy of the implanted ion is less than about 100 eV. A light ion such as helium tends to backscatter rather than displace silicon. Although slightly lighter than silicon, neon displaces silicon. While the heavier group Zero ions such as argon and krypton do effectively displace silicon, they require greater energy to achieve a given projected range. The need for greater implant energy is of some concern, in that a silicon substrate exposed to such high energy bombardment may suffer permanent surface damage that would adversely affect epitaxial growth. If equipment capable of making a higher energy implant and an effective healing technique are available, the heavier group Zero ions may be used if desired.

The unit process for forming the structures of FIGS. 2-7 begins with a crystalline silicon substrate 200, as shown in FIG. 2. A common silicon substrate material is n-type <100> Czochralski silicon wafers, suitably doped for the particular type of integrated circuit being fabricated. Other substrate material may be used if desired, and the substrate material may have epitaxial silicon deposited thereon.

Refer to the structure shown in FIG. 3. Neon is implanted into the area in which the isolation structure is to be located at a dose of, for example, about $4 \times 10^{16}$ $Ne^+/cm^2$ and an energy of, for example, about two MeV. Generally, the higher the implant energy, the greater the dose needed. Generally, at 2 MeV, a dose greater than about $10^{16}$ $Ne^+/cm^2$ is preferable. Note that if the area in which the isolation structure is to be located is to be limited to a particular area of the integrated circuit, a further masking process is required prior to the neon implant step. The implant creates a region 204 of peak implant concentration and greatest lattice damage at a projected range of about eight microns below the surface of the silicon substrate 200.

A suitable ion implant machine is the model NV-"1002" implanter, available from Eaton Corporation of Beverly, Mass. Neon implant services are also commercially available from the Eaton Corporation.

Following the neon implant, the resulting structure is furnace annealed at, for example, about 900 degrees Centigrade in a nitrogen ambient for a time of, for example, about thirty minutes. This anneal recrystallizes any lightly damaged regions near and at the surface of the substrate 200 to heal the damage from the implant and to remove any neon residing near and at the surface of the substrate 200. These measures are taken to minimize interference with subsequent epitaxial growth. As a result of the anneal, an undamaged single crystal layer 203 forms to a thickness of, for example, about 2.5 $\mu m$ over the damaged area 204.

Other techniques for healing surface damage may be used if desired. For example, one technique involves the growth of a thin epitaxial layer (not shown) of about 0.5 $\mu m$, followed by an implant of Ge or Si at a dose of about $1 \times 10^{15}$ at 80 keV. The thin implanted epitaxial layer is annealed at about 950 or 1000 degrees Centigrade for about 30 minutes. This anneals the damage, and the process continues with further epitaxial deposition to the desired thickness.

Figure 4:
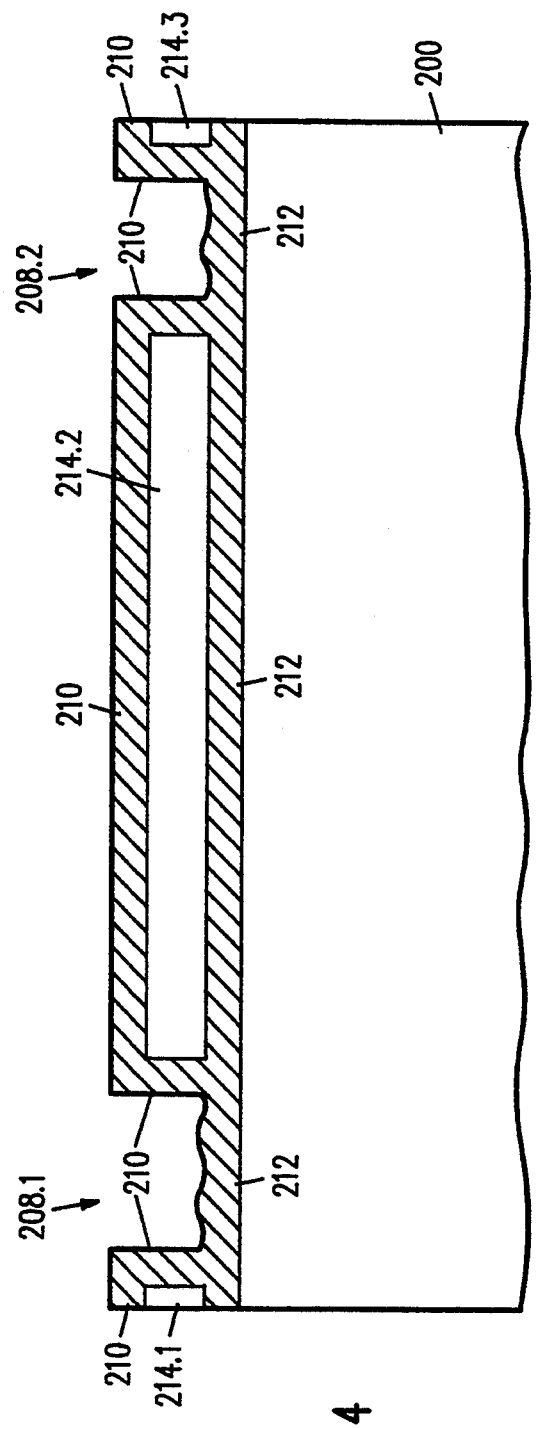

An oxide layer 202 is grown or deposited, as desired, on the silicon substrate 200 to a thickness of, for example, about 1.5 μm. Photoresist layer 206 is deposited and patterned to exposed region 207 (comprising regions 207.1 and 207.2) of the pad oxide 202 for the fabrication of trenches. The exposed region 207 may be any suitable width; for example, in this embodiment it is 5 μm wide to ensure complete filling of the subsequently formed trenches in subsequent process steps. A conventional plasma etch is used first to etch through the exposed portion 207 of the oxide 202, then to etch into the substrate 200 to form a trench 208 preferably in a closed form (sections 208.1 and 208.2 are shown), as illustrated in FIG. 4. Trench 208 passes through the substrate layer 203 and terminates in the vicinity of the damaged region 204. The resist 206 is stripped in any suitable manner.

Refer to FIG. 4. In the next step, the substrate 200 is exposed to a high pressure wet oxidation to convert the amorphized silicon regions 204 to isolation oxide 212. The high pressure wet oxidation provides rapid distribution of oxygen to the amorphized regions of the lattice to increase the oxidation rate. The substrate 200 is oxidized in a wet $O_2$ environment at a temperature of, for example, about 900 degrees Centigrade and a pressure of, for example, about 10 atmospheres for a time of, for example, about 30 minutes. At the same time, an oxide coating 210 forms on all exposed silicon areas. As a result, isolated silicon regions or islands 214 are formed in selected regions of the substrate 200.

Oxidation proceeds effectively when the neon implant dose is sufficiently large to prevent full recrystallization. The size and distribution of trenches such as 208 are based on the size required of the islands 214, limited by the goal of effectively oxidizing the entire damaged region 204. The trench 208 also allows relaxation of strain resulting from the oxidation of the buried implant layer 204. The neon is believed both to escape through trench 208 and to become trapped in the isolation oxide region 212. Trapped neon acts as insulation and thereby improves the breakdown performance of the isolation oxide region 212.

Figure 5:
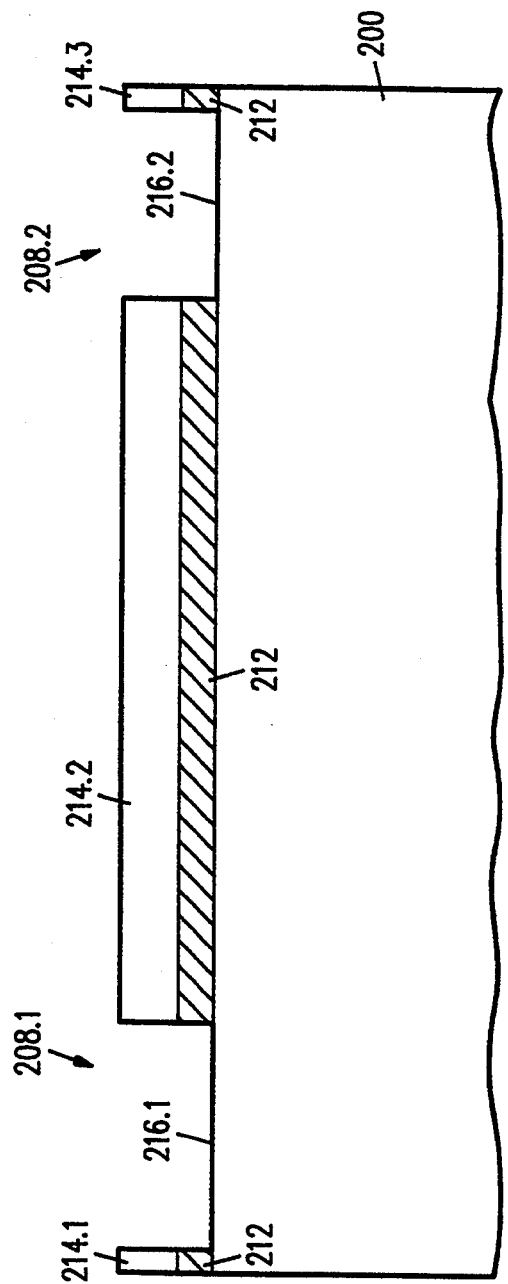

Refer to FIG. 5. The structure of FIG. 4 is exposed to any suitable isotropic etch such as a plasma etch using $CF_4$, which leaves intact the localized buried isolation structures 212 and exposes the top and side surfaces of the single crystal islands 214 (214.1, 214.2 and 214.3) and the surfaces 216.1 and 216.2 of the substrate 200.

Figure 6:
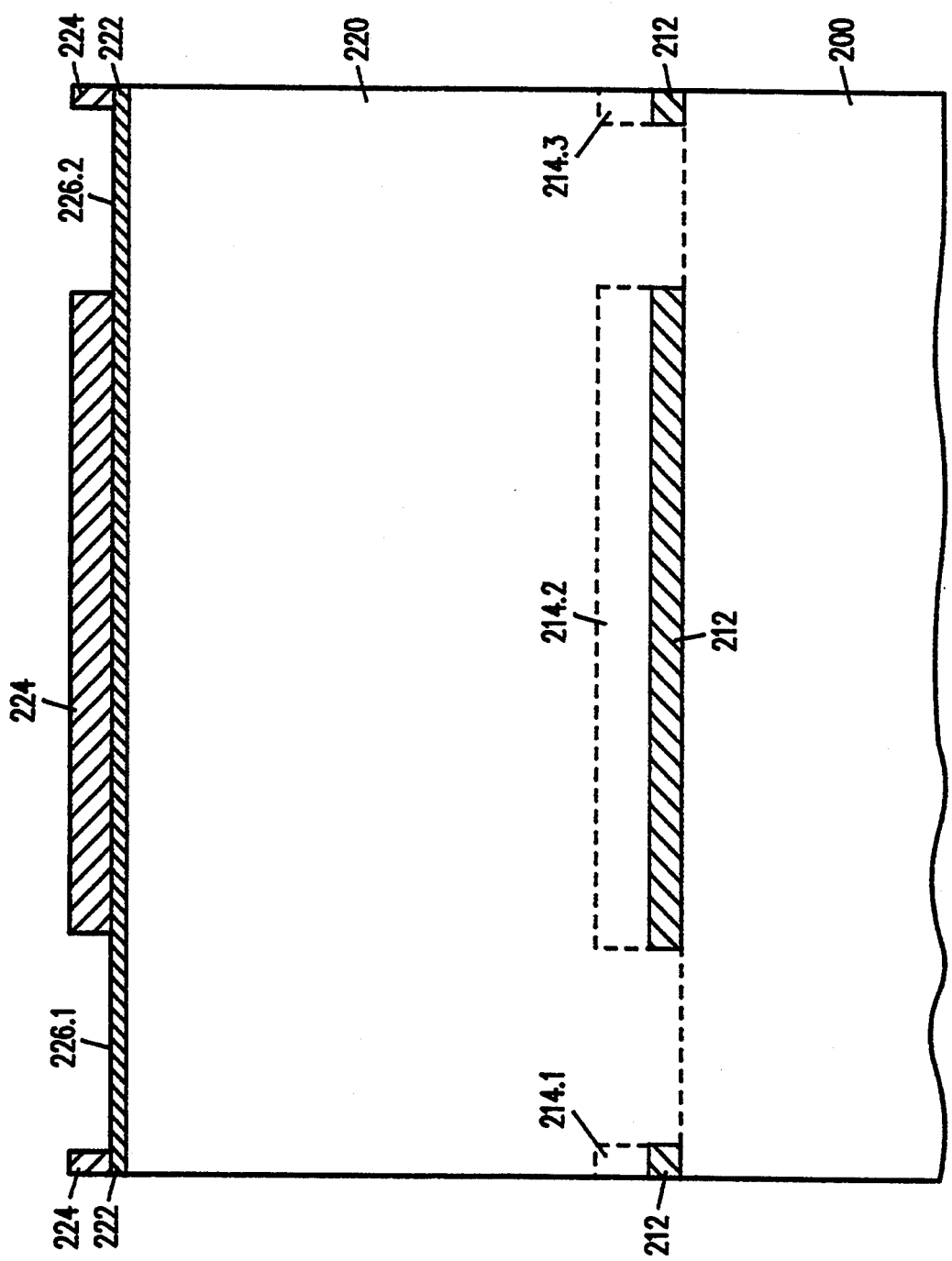

Refer to FIG. 6. The structure of FIG. 5 is subjected to a conventional epitaxial deposition using $SiH_4$ to form an epitaxial layer 220 about fifteen microns thick. Layer 220 may be formed to other thicknesses, if desired, and may be doped if desired. Note that the outline of the surfaces of the original single crystal islands 214.1, 214.2 and 214.3 and the original single crystal substrate 200 are shown in dashed lines. Another masking step begins with the growth over the epitaxial layer 220 of a pad oxide 222 of, for example, about 0.1 μm thickness. A layer 224 of photoresist is deposited and patterned with a mask similar to the mask used to pattern the trenches 208, except that the openings in the mask are relatively oversized to ensure that trenches subsequently formed will intersect the isolation structure 212. Surface regions 226 (226.1 and 226.2) of the pad oxide layer 222 are exposed. Using any suitable anisotropic etch such as a plasma etch, the exposed areas 226 of oxide 222 are removed, and the epitaxial silicon 220 is etched down to the level of the isolation structure 212 to form trenches 230.1 and 230.2 (FIG. 7). The resist 224 is stripped in any suitable manner, and the substrate 200 is exposed to a high pressure wet oxidation to form an oxide coating of about 1.5 μm thickness on the sidewalls and horizontal surfaces 250–258 of the islands 240 (240.1, 240.2 and 240.3). The substrate 200 is oxidized in, for example, a wet $O_2$ environment at a temperature of, for example, about 900 degrees Centigrade and a pressure of, for example, about 10 atmospheres for a time of, for example, about 120 minutes. As a result, isolated silicon regions or islands 240 are formed in selected regions of the substrate 200.

The completed isolation structure includes the isolation oxide region 212 in combination with the sidewalls 251 and 253 and floor 252 of trench section 230.1, and the sidewalls 255 and 257 and floor 256 of trench section 230.2. The horizontal surface oxide sections 250, 254 and 258 typically are removed during subsequent device fabrication steps, and the cavity of trench 230 typically is filled with any suitable material using any suitable deposition technique, followed by any suitable planarization technique and etch-back to the surface of the islands 240. For example, the trench 230 is filled by the chemical vapor deposition of a silicon dioxide film, followed by chemical or mechanical polishing for planarization.

A unit process for forming regions isolated by a resistive semiconductor region rather than a dielectric oxide includes an ultra high energy implant of neon or other suitable material into the semiconductor, as discussed above with reference to FIG. 3; followed by epitaxial growth of semiconductor material, if desired, as discussed above with reference to FIG. 6; followed by the formation of trenches, as discussed above with reference to FIG. 7.

The unit isolation processes described above are suitable for use in a variety of processes for fabricating a variety of devices. Following is a description of a process for fabricating high voltage/high power NPN transistors and n-channel lateral DMOS transistors, which includes many well known process steps but also includes the oxide isolation unit process described above. The process described is merely illustrative.

The slice or wafer 400 on which the DMOS and NPN devices are fabricated is n-type doped silicon having a <100> orientation. The wafer is cleaned and polished, and the oxide isolation unit process described in association with FIGS. 2–7 is completed to form two islands 410 and 430 for, respectively, an NPN transistor and an n-channel DMOS transistor. The upper 13.5 μm of the islands 410 and 430 is epitaxial silicon, grown upon respective 1.5 μm regions obtained from that portion of the single crystal substrate 400 above the region damaged by the neon implant, and doped with a suitable n-type dopant such as phosphorous. If desired, buried layers may be provided in the islands 410 and 430, either by differential doping during epitaxial growth, or by using a high energy phosphorus implant, following generally the teachings associated with FIGS. 2A–2D of the aforementioned U.S. Pat. No. 5,043,292, which is incorporated herein by reference.

Figure 8:
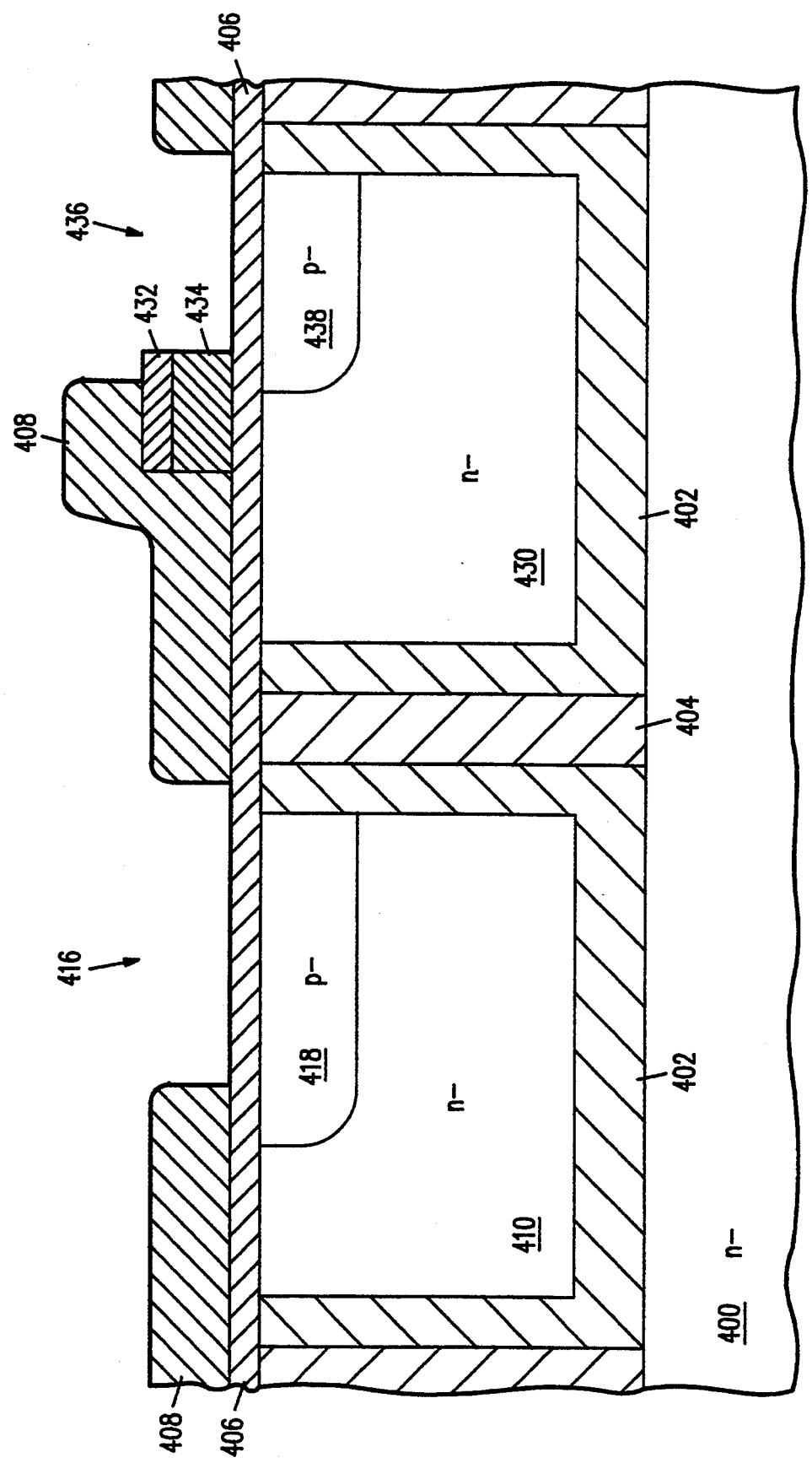
FIGS. 8 and 9 are cross-sectional views of an NPN device and a DMOS device in successive stages of fabrication in respective oxide-isolated islands, in accordance with an illustrative device fabrication process.

The resulting isolation structure, which is shown in FIG. 8, includes the oxide 402 about the islands 410 and 430, and oxide 404 filling the trench between the islands 410 and 430. The fill oxide 404 is achieved by a blanket deposition of a silicon dioxide film using any suitable deposition technique, followed by any suitable planarization technique and etch back to the surfaces of the islands 410 and 430.

Next, a gate masking step is performed. A uniform, high integrity gate oxide film is grown across the surfaces of the islands 410 and 430. A polysilicon film is deposited on the gate oxide film. The polysilicon film is heavily doped with a suitable n-type dopant such as phosphorous. A mask oxide is formed over the polysilicon film, followed by the deposition of a photoresist layer. The photoresist is patterned and the mask oxide is etched to create a gate mask 432, which is also used for the subsequent self-aligned double diffusions. The photoresist is stripped, and the polysilicon film is etched through the mask oxide to form a polysilicon gate 434.

Next, a body/base implant masking step is performed. A layer of photoresist 408 is deposited and patterned to create openings 416 and 436 to the gate oxide film 406 over, respectively, a base region of the island 410 and a drain region of the island 430. A p-body/base implant is made through the openings 416 and 436 and driven-in to form base region 418 and body region 438. The photoresist mask 408 is stripped.

Figure 9:
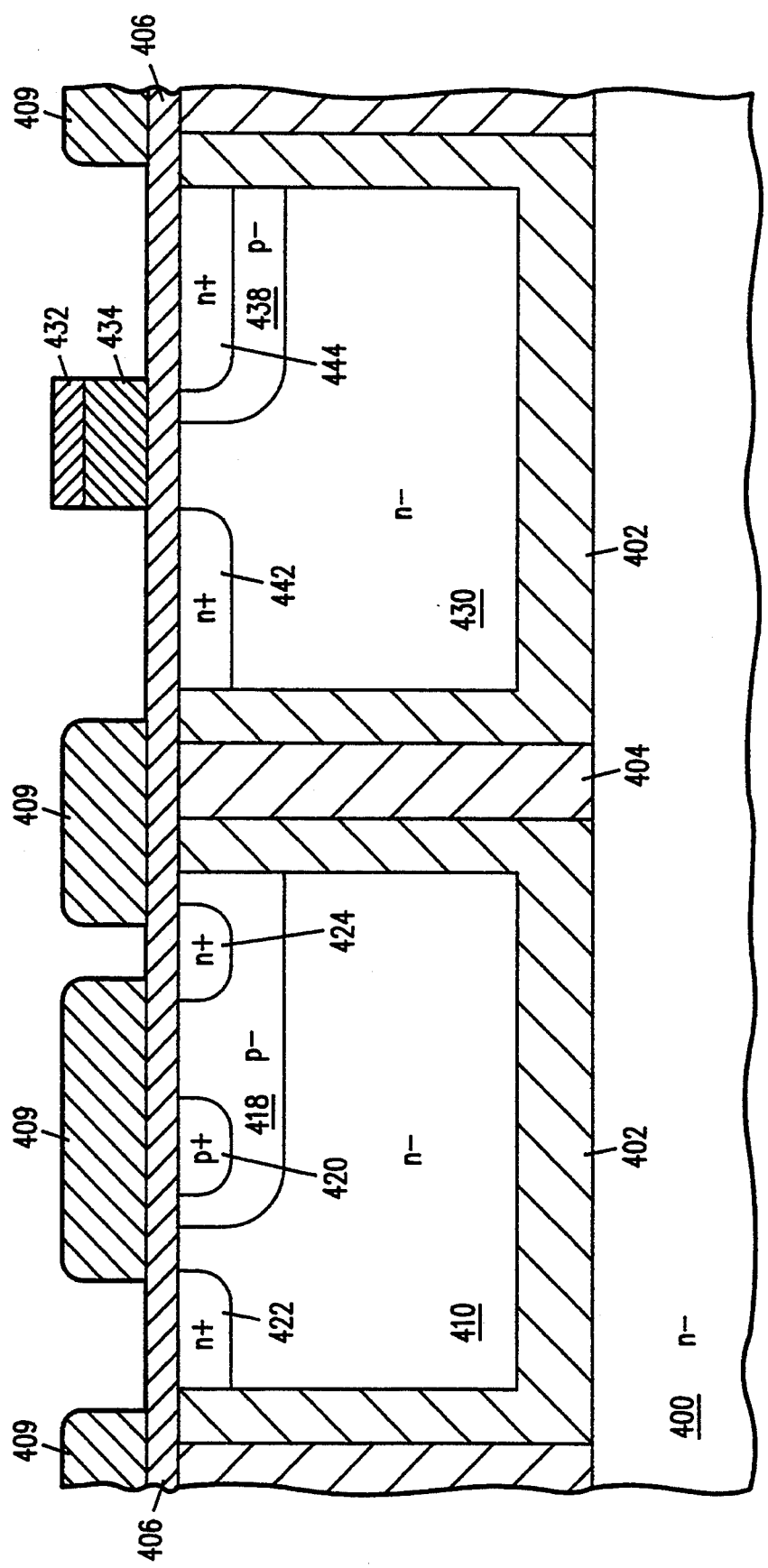

Next, a base contact implant masking step is performed. A layer of photoresist is deposited and patterned to create an opening to the gate oxide film 406 over a contact area for the base region 418. A suitable p-type dopant such as boron is implanted and driven in to form base contact region 420 (FIG. 9). The base contact implant mask is stripped.

Next, a source/drain/emitter/contact implant masking step is performed. As shown in FIG. 9, a layer of photoresist 409 is deposited and patterned to create openings to the gate oxide film 406 over regions that are to be an emitter 424, a collector contact region 422, a source 442, and a drain 444. A suitable n-type dopant such as phosphorous is implanted to form the collector contact region 422, the emitter 424, the source 442, and the drain 444. The photoresist 409 is stripped.

Next, metallization, passivation, dicing, and packaging steps are performed.

If isolation structures of the type shown in FIG. 7 are to be formed only in a limited region of the substrate 200, an isolation area masking step is included in the overall process to mask areas of the substrate 200 over which the isolation structures are not to be formed. The masking technique disclosed in the aforementioned U.S. Pat. No. 5,043,292 is suitable for neon as well, and is incorporated herein by reference. Briefly, prior to making the high energy neon implant, a suitable mask material is deposited and patterned. Generally, about 4 μm of polysilicon thickness per 1 Mev in implant energy is sufficient as a blocking layer for the neon implant. A combination of alternating 2.0–2.5 μm polysilicon layers and thin titanium or tungsten silicide layers is particularly useful for creating thick implant masks, since the intervening thin titanium or tungsten layers reduces strain problems that can occur if the polysilicon layer thickness exceeds 2.5 μm, and provides a conductive silicide layer at convenient depths in the device structure.

While the invention has been described with respect to the embodiments and variations set forth above, these embodiments and variations are illustrative and the invention is not to be considered limited in scope to these embodiments and variations. For example, an alternative process for forming the various trenches of the above description is to mask the forming single crystal silicon islands with silicon nitride. Trenches fifteen microns wide are formed, and their sidewalls are oxidized under wet conditions. The resulting structure is exposed to silane under epitaxial growth conditions, whereby silicon fills the trenches but fails to form on the nitride protective surface. As a further example, the dimensions and the various dopant concentrations and profiles set forth herein are illustrative, and other concentrations and profiles may also be effective for the intended purpose. Moreover, the various individual processes and equipment discussed herein are illustrative, and other processes and equipment may also be effective for the intended purpose. Accordingly, other embodiments and variations not described herein are to be considered within the scope of our invention as defined by the following claims.

What is claimed is:

1. A method of forming a dielectrically isolated single crystal semiconductor island in a silicon semiconductor body, comprising the steps of:

implanting neon ions into the body through a surface of the body at an energy and a dose so that a first region inside the body is substantially amorphized while a second region of the body between the surface thereof and the first region is not substantially amorphized;

forming a trench in the body from the surface to the first region, the trench being defined at least in part by a sidewall of the second region; and subjecting the body to an oxidizing environment to convert the first region to an oxide and the sidewall of the second region to an oxide;

wherein the dose of said implanting step suppresses complete recrystallization of the first region during said subjecting step.

2. A method as in claim 1, wherein the neon ion implanting step further comprises the step of implanting neon ions at a dose of at least about $1 \times 10^{16}$ Ne+/cm$^2$.

3. A method as in claim 1, further comprising the step, subsequent to the neon ion implanting step, of annealing the body to heal any damage at the surface of the body.

4. A method as in claim 1, further comprising, prior to the neon ion implanting step, the steps of:

forming an oxide layer over a major surface of the body, the major surface including the surface;

forming an implant mask over the oxide layer, the implant mask comprising an effective thickness of polysilicon proportional to the neon ion implant energy in the ratio of about 4 μm of polysilicon per 1.0 MeV of implant energy; and removing a portion of the implant mask from over the surface.

5. A method of forming a dielectrically isolated single crystal semiconductor island in a semiconductor body, comprising the steps of:

implanting neon ions at an energy of at least about two MeV into the body through a surface of the body at an energy and a dose so that a first region inside the body is substantially amorphized while a second region of the body between the surface thereof and the first region is not substantially amorphized;

forming a trench in the body from the surface to the first region, the trench being defined at least in part by a sidewall of the second region; and subjecting the body to an oxidizing environment to convert the first region to an oxide and the sidewall of the second region to an oxide;

wherein the dose of said implanting step suppresses complete recrystallization of the first region during said subjecting step.

6. A method of forming a dielectrically isolated single crystal semiconductor island in a silicon semiconductor body, comprising the steps of:

implanting neon ions into the body through a surface of the body at an energy and a dose so that a first region inside the body is substantially amorphized while a second region of the body including the surface and extending to the first region is not substantially amorphized;

forming a first trench in the body from the surface to the first region, the trench being defined at least in part by a first sidewall of the second region;

subjecting the body to an oxidizing environment to convert at least a portion of the first region to a continuous buried oxide layer, and the first sidewall and surface of the second region to oxide, wherein the dose of said implanting step suppresses complete recrystallization of the first region;

removing oxide from the surface of the second region remaining after said first trench forming step and said oxidizing environment subjecting step to expose single crystal semiconductor material of the body;

epitaxially depositing semiconductor material on the exposed single crystal semiconductor material of the body to form an epitaxial layer;

forming a second trench in the epitaxial semiconductor layer from a surface thereof to the buried oxide layer, the second trench being defined at least in part by a sidewall of the epitaxial layer and a second sidewall of the second region; and forming a dielectric layer on the sidewall of the epitaxial layer and on the second sidewall of the second region.

7. A method as in claim 6, wherein the neon ion implanting step further comprises the step of implanting neon ions at a dose of at least about $1 \times 10^{16}$ Ne+/cm$^2$.

8. A method as in claim 6, further comprising the step, subsequent to the neon ion implanting step, of annealing the body to heal any damage at the surface of the body.

9. A method as in claim 6, further comprising the step of filling the second trench.

10. A method as in claim 6, wherein the first trench forming step is performed using a first mask, and wherein the second trench forming step if performed using a second mask, the second mask and the first mask being identical.

11. A method as in claim 6, wherein the first trench forming step is performed using a first mask, and wherein the second trench forming step is performed using a second mask, features of the second mask being slightly oversized relative to corresponding features of the first mask.

12. A method as in claim 6, further comprising, prior to the neon ion implanting step, the steps of:

forming an oxide layer over a major surface of the body, the major surface including the surface;

forming an implant mask over the oxide layer, the implant mask comprising an effective thickness of polysilicon proportional to the neon ion implant energy in the ratio of about 4 μm of polysilicon per 1.0 MeV of implant energy; and removing a portion of the implant mask from over the surface.

13. A method for forming dielectrically isolated single crystal silicon islands in a silicon substrate, comprising the steps of:

implanting neon into the substrate at an energy and a dose so that an amorphized region is formed within the substrate;

forming a first trench mask over the substrate, the windows thereof being disposed over the amorphized region;

etching the substrate through the first trench mask at least into proximity with the amorphized region to form single crystal substrate regions separated from one another by trenches and from an underlying region of the substrate by respective sections of the amorphized region;

oxidizing the amorphized region sections to form dielectric segments underlying the single crystal substrate regions, wherein the dose of the implanted neon suppresses completed recrystallization of the amorphized region;

exposing respective upper surfaces of the single crystal substrate regions;

growing a layer of epitaxial silicon on the upper surfaces of the single crystal substrate regions;

forming a second trench mask over the epitaxial silicon layer, the epitaxial silicon layer being exposed through the second trench mask in a pattern substantially similar to the pattern of the first trench mask; and etching the epitaxial silicon through the second trench mask at least into proximity with the dielectric segments to form single crystal islands separated from one another by trenches and from the underlying substrate region by the dielectric segments.

14. A method as in claim 13 further comprising the step of filling space between the single crystal island with dielectric material.

15. A method as in claim 13, further comprising the step of oxidizing sidewalls of the single crystal islands, the oxidized sidewalls of the single crystal islands merging with the dielectric segments to form a dielectric isolation structure.

16. A method as in claim 15 wherein the dielectric isolation structure include gaps between the single crystal islands, comprising the step of filling the gaps.

17. A method as in claim 16, wherein the gap is filled with a material having a coefficient of thermal expansion similar to that of silicon.

18. A method as in claim 13, wherein the neon implanting step comprises the step of implanting neon ions at a dose of at least about $1 \times 10^{16}$ Ne+/cm$^2$ and at an energy of at least about two MeV.

19. A method of forming a dielectrically isolated single crystal semiconductor island in a semiconductor body, comprising the steps of:

implanting neon ions at an energy of at least about two MeV into the body through a surface of the body at an energy and a dose so that a first region inside the body is substantially amorphized while a second region of the body including the surface and extending to the first region is not substantially amorphized;

forming a first trench in the body from the surface to the first region, the trench being defined at least in part by a first sidewall of the second region;

subjecting the body to an oxidizing environment to convert at least a portion of the first region to a continuous buried oxide layer, and the first sidewall and surface of the second region to oxide, wherein the dose of said implanting step suppresses complete recrystallization of the first region;

removing oxide from the surface of the second region remaining after said first trench forming step and said oxidizing environment subjecting step to expose single crystal semiconductor material of the body;

epitaxially depositing semiconductor material on the exposed single crystal semiconductor material of the body to form an epitaxial layer;

forming a second trench in the epitaxial semiconductor layer from a surface thereof to the buried oxide layer, the second trench being defined at least in part by a sidewall of the epitaxial layer and a second sidewall of the second region; and forming a dielectric layer on the sidewall of the epitaxial layer and on the second sidewall of the second region.

20. A method of forming a resistively isolated single crystal semiconductor island in a silicon semiconductor body, comprising the steps of:

implanting neon ions into the body through a surface of the body at an energy and a dose so that a first region inside the body is substantially amorphized while a second region of the body between the surface thereof and the first region is not substantially amorphized; and forming a trench in the body from the surface to the first region, the trench being defined at least in part by a sidewall of the second region.

21. A method as in claim 20, further comprising the step, subsequent to the neon ion implanting step, of annealing the body to heal any damage at the surface of the body.

22. A method of forming a resistively isolated single crystal semiconductor island in a germanium semiconductor body, comprising the steps of:

implanting neon ions into the body through a surface of the body at an energy and a dose so that a first region inside the body is substantially amorphized while a second region of the body between the surface thereof and the first region is not substantially amorphized; and forming a trench in the body from the surface to the first region, the trench being defined at least in part by a sidewall of the second region.

23. A method as in claim 22, further comprising the step, subsequent to the neon ion implanting step, of annealing the body to heal any damage at the surface of the body.

* * * * *